US006815246B2

(12) United States Patent
Gonsiorawski et al.

(10) Patent No.: US 6,815,246 B2
(45) Date of Patent: Nov. 9, 2004

(54) SURFACE MODIFICATION OF SILICON NITRIDE FOR THICK FILM SILVER METALLIZATION OF SOLAR CELL

(75) Inventors: Ronald C. Gonsiorawski, Danvers, MA (US); Grace Xavier, Billerica, MA (US)

(73) Assignee: RWE Schott Solar Inc., Billerica, MA (US)

( * ) Notice: Subject to any disclaimer, the term of this patent is extended or adjusted under 35 U.S.C. 154(b) by 0 days.

(21) Appl. No.: 10/365,774

(22) Filed: Feb. 13, 2003

(65) Prior Publication Data

US 2004/0161872 A1 Aug. 19, 2004

(51) Int. Cl.$^7$ ............................................... H01L 21/00
(52) U.S. Cl. ............................ 438/57; 438/73; 438/96; 438/482
(58) Field of Search ............................ 438/57, 73–80, 438/86–98, 482–490; 136/243–265

(56) References Cited

U.S. PATENT DOCUMENTS

| | | | |
|---|---|---|---|
| 5,190,064 A | 3/1993 | Aigo | |
| 5,388,769 A | 2/1995 | Rodrigo et al. | |
| 5,466,424 A | 11/1995 | Kusano et al. | |
| 6,042,637 A | 3/2000 | Weinberg | |
| 6,373,680 B1 | 4/2002 | Riskin | |
| 6,429,595 B1 | 8/2002 | Hammen et al. | |
| 6,492,613 B2 | 12/2002 | Bollinger et al. | |
| 6,664,566 B1 * | 12/2003 | Yamazaki | 257/53 |

OTHER PUBLICATIONS

Corotec Corporation, Plasma–Jet Series; 3–D Surface Treatment Equipment; Installation, Operation, and Procedures Manual; model No. PJ–2.

* cited by examiner

Primary Examiner—H. Jey Tsai
(74) Attorney, Agent, or Firm—Pandiscio & Pandiscio

(57) ABSTRACT

In the manufacture of a wafer-type silicon solar cell having on its front side a silicon nitride AR coating and an electrical contact that is formed by printing a thick film metal ink onto the silicon nitride in the form of a grid-like pattern having narrow fingers and then firing that ink to convert it to a bonded metal contact, a surface treatment method is provided to adjust the condition of the surface of the silicon nitride coating in a manner that substantially improves the adherence of the thick film ink to the silicon nitride coating, thereby eliminating or substantially inhibiting the tendency of the narrow fingers of the unfired ink to peel away before the ink has been fired to produce the electrical contact. The surface treatment method comprises subjecting the silicon nitride layer to a corona discharge using a plasma jet and is readily incorporated into the manufacturing process sequence without requiring any modification of existing stages of that sequence.

14 Claims, 3 Drawing Sheets

SURFACE MODIFICATION OF SILICON NITRIDE FOR THICK FILM SILVER METALLIZATION OF SOLAR CELL

This invention was made under NREL Subcontract No. ZAF-6-14271-10, which is a subcontract under U.S. Prime Contract No. DE-AC 36-83-CH10093.

FIELD OF THE INVENTION

This invention relates to the manufacture of photovoltaic cells and more particularly to the manufacture of thick film silver contacts on silicon solar cells.

BACKGROUND OF THE INVENTION

Photovoltaic cells ("solar cells") directly convert radiant energy from the sun into electrical energy. One mode of manufacturing such devices commences with provision of semiconductor substrates in the form of doped silicon sheets or wafers. By way of example, the solar cell substrates may be rectangular wafers cut out of EFG-grown polycrystalline silicon bodies. Typically such wafers are of p-type conductivity and have a thickness in the range of 0.011 to 0.015 inches. Other substrates may be used to make silicon solar cells, e.g., circular or square single crystal silicon substrates and rectangular cast polycrystalline silicon substrates.

The manufacture of solar cells using polycrystalline or single crystal substrates involves a number of steps, including formation of a shallow p-n junction and deposition of a thin electrically-insulating anti-reflection ("AR") coating on one surface of the wafer (the "front" surface of the wafer). Typically the p-n junction is formed by a diffusion process and is located about 0.3–0.5 microns below the "front" surface of the wafer, and the AR coating consists of a silicon nitride coating with a thickness in the range of about 600 to about 1000 (usually about 800) Angstroms that fully cover that front surface. It is to be noted that the silicon nitride AR coating may be replaced by an oxide of silicon or titanium that also is transparent to solar radiation. For the purposes of this invention description, substrates that have been processed to include a p-n junction and an AR coating are identified hereinafter as "solar cell wafers".

The solar cell wafers are converted to finished solar cells by forming electrical contacts (sometimes referred to as "electrodes") on their front and rear surfaces whereby to permit recovery of an electrical current from the cells when they are exposed to solar radiation. Various materials have been used as electrical contacts for solar cells, the most common being silver, aluminum and nickel.

The contact on the front surface of the cell is generally in the form of a grid, comprising an array of narrow elements known as "fingers" and at least one elongate bus (also called a "bus bar") that intersects the fingers. The width and number of the fingers and busses are selected so that the area of the front surface exposed to solar radiation is maximized. The front contact comprises silver as the electrically conductive constituent.

Both thin film and thick film techniques have been used for the formation of electrical contacts on solar cells. Thin film manufacturing techniques include vapor deposition, sputtering and electroless plating. Thin film techniques permit the formation of pure metal contacts, with the result that the contacts exhibit excellent electrical properties. Thick film technology involves using a somewhat viscous metal-containing paste (also referred to as a metal-containing ink) to form a relatively thick metal-containing film on the substrate, and then firing that film so as to make an electrically-conductive layer that is strongly bonded to the substrate.

A number of techniques exist for forming thick film electrically-conductive components on solar cells and other semiconductor substrates, including screen printing, pad printing, and direct writing. Pad printing thick film components is described in U.S. Pat. No. 5,151,386, issued Sep. 29, 1992 to Frank J. Bottari et al. for "Method Of Applying Metallized Contacts To A Solar Cell"). Direct writing of thick film components is disclosed in U.S. Pat. No. 5,151,377, issued Sep. 29, 1992 to Jack I. Hanoka et al. for "Method For Forming Contacts". The disclosures of the foregoing patents are incorporated herein by reference. A preferred arrangement is to form the back contact by pad printing and to form the front contact by direct writing The direct writing method disclosed and claimed in said U.S. Pat. No. 5,151,377 is a preferred technique since it can be integrated into a mass production manufacturing process and is capable of forming front grid-type contacts with tall as well as narrow fingers. Making the fingers narrow is desirable to minimize light shadowing (i.e., to expose as much as possible of the front surface of the solar cell to solar radiation). Increasing the height of the fingers without a corresponding increase in finger width is desirable so as to maximize the current-carrying capacity of the fingers. The writing involves use of an ink that comprises a mixture of silver particles and a glass frit in a vehicle that comprises a pyrolyzable organic binder and an organic solvent that evaporates at a relatively low temperature. A suitable ink is described in said U.S. Pat. No. 5,151,377. The ink is used to print the grid pattern on the silicon nitride coating, after which the solar cell wafer is fired to cause the ink to penetrate the silicon nitride and form a front electrical contact bonded to the silicon substrate.

The present invention concerns a problem encountered in producing front grid-type contacts by printing a thick film grid contact pattern on the silicon nitride AR according to the method disclosed in U.S. Pat. No. 5,151,377 (cited supra). The finger sections of the grid pattern are printed after the bus bar portions. Prior to being fired the tall and narrow fingers formed by the ink are fragile and susceptible to disruption. The problem consists of at least a portion of one or more fingers of the printed grid pattern peeling away from the silicon nitride surface as a consequence of sensitivity to moisture and also because of the surface condition of the silicon nitride coating. This peeling occurs while the ink is still wet and is evidenced by voids in the fingers portion of the grid contact after the wafer has exited the firing furnace. It appears that the presence of moisture tends to make the fingers narrower, and this contraction reduces the contact angle of the ink relative to the silicon nitride, which in turn results in a reduction of the adherence or bond strength of the ink to the silicon nitride. The peeling phenomenon results in loss of performance or outright rejection of a number of finished solar cells due to imperfect grid contacts.

OBJECTS AND SUMMARY OF THE INVENTION

Accordingly the primary object of the invention is to provide a treatment that substantially reduces or eliminates the tendency of narrow elements of a wet ink contact pattern of the type described to peel away from an underlying silicon nitride layer.

A more specific object is to adjust the condition of the surface of the silicon nitride AR layer of a solar cell wafer in a manner that effectively reduces the tendency of the narrow fingers of a printed ink grid electrode pattern to peel away before or during the subsequent firing required to convert the printed pattern into an effective electrical contact.

Another object is to achieve the foregoing objects by a method that is incorporated into a solar cell manufacturing process sequence without requiring any other modification of that sequence.

Still another object is to provide a method of manufacturing photovoltaic cells comprising printing and firing of electrical contacts on the front and back sides of solar cell wafers having a silicon nitride coating on their front sides, characterized by pre-treating the silicon nitride coating of each wafer with an ionized air stream produced by a corona discharge prior to printing on the wafer's front side.

The foregoing objects are achieved by subjecting the surface of the silicon nitride layer to a corona discharge surface treatment that effectively increases the wettability of that surface by the printing ink. The corona discharge surface treatment is accomplished using an apparatus that produces a plasma jet and directs it at the silicon nitride surface. It is believed that corona discharge treatment increases the surface energy level of the silicon nitride layer, and that the increased surface energy results in the improved wettability. The improved wettability is evidenced by improved adherence of the thick film ink used to form the printed grid-type contact pattern, with the result that lifting or peeling of the fingers of the grid-type printed pattern prior to firing is substantially eliminated. The printed grid contact pattern remains intact throughout the subsequent high temperature firing to create a bonded high performance electrical contact. Other features and aspects of the invention are described or set forth in the following detailed description of the invention which is to be considered together with the accompanying drawings.

THE DRAWINGS

Figure 4:
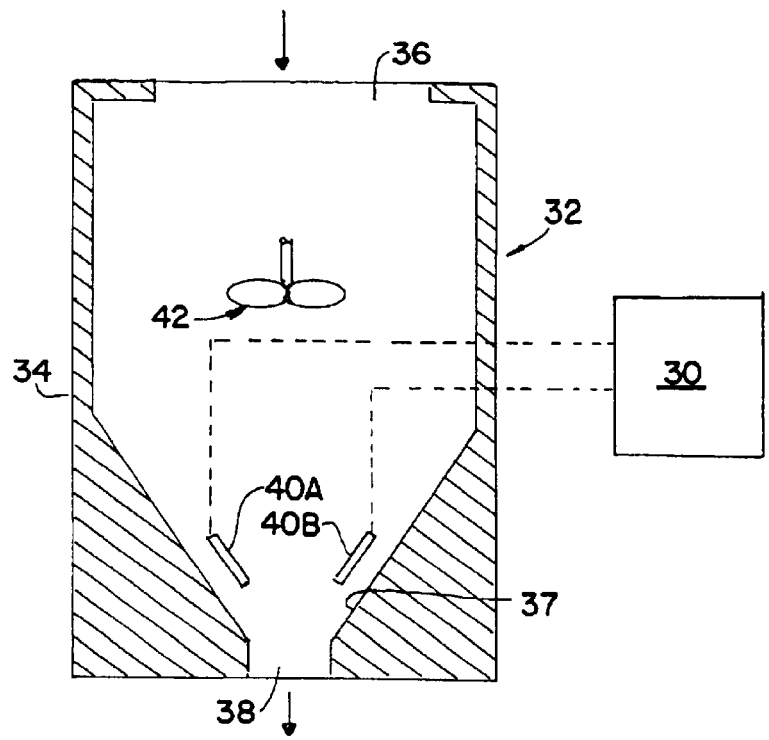
Figure 5:
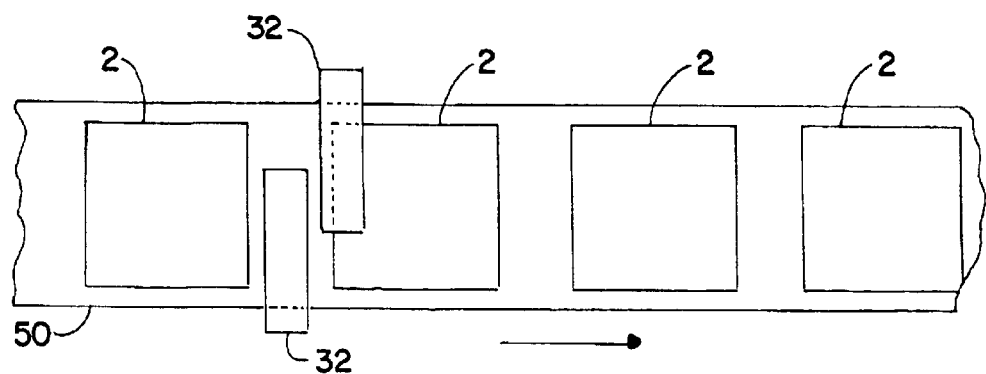
Figure 6:
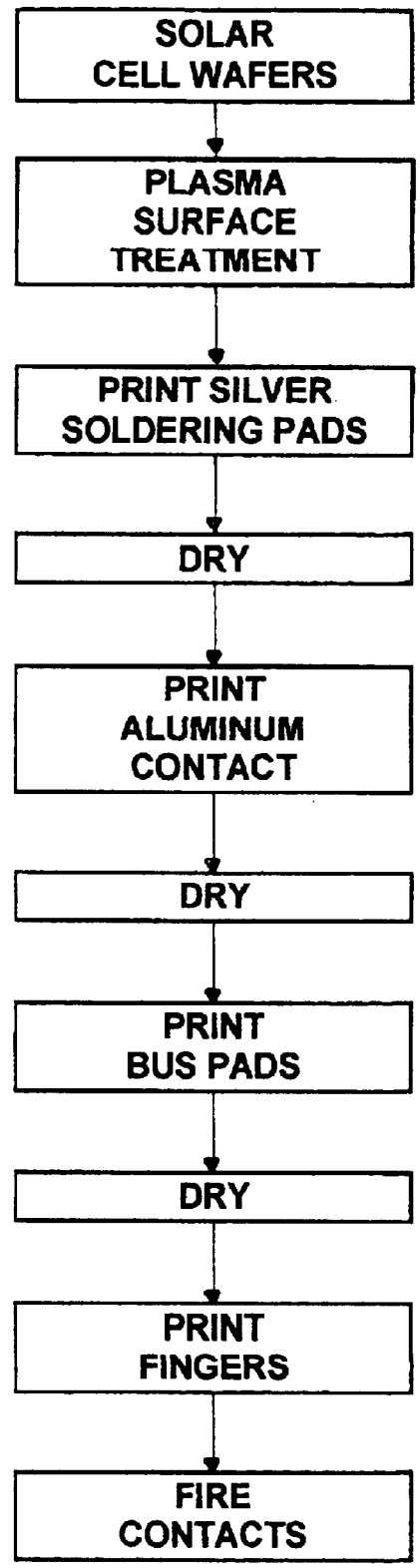

FIG. 4 schematically illustrates a plasma jet apparatus;

FIG. 5 illustrates how two plasma jet discharge heads are mounted in relation to wafers to be treated; and FIG. 6 diagrammatically illustrates a known process for creating contacts on solar cell wafers modified to include a plasma pre-treatment of the silicon nitride coating in accordance with the invention.

DETAILED DESCRIPTION OF THE INVENTION

Figure 1:
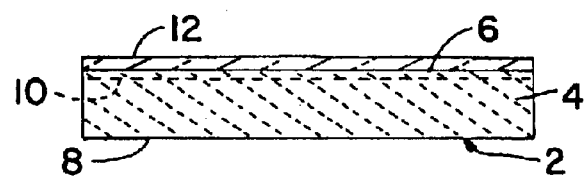
FIG. 1 is a schematic cross-sectional view of a solar cell wafer having a silicon nitride coating on one surface.

Referring to FIG. 1, there is illustrated a silicon solar cell wafer 2 in the form of a silicon sheet or substrate 4 having front and back (top and bottom) surfaces 6 and 8 respectively, a p-n junction 10 adjacent front surface 6 and a silicon nitride coating 12 overlying front surface 6. The silicon sheet may be polycrystalline, e.g., a wafer cut out of an EFG-grown hollow silicon body, or a single crystal wafer. For the purpose of this invention the methods of producing p-n junction 10 and silicon nitride coating 12 are not critical. By way of example but not limitation, the p-n junction is preferably formed according to the method described in U.S. Pat. No. 5,270,248, issued Dec. 14, 1993 to M. D. Rosenblum et al for "Method For Forming Diffusion Junctions in Solar Cell Substrates": Also by way of example but not limitation, the silicon nitride coating is formed according to the process described in United Kingdom Patent No. 2,215, 129 granted on an invention or A. R. Chaudhuri et al for "Method Of Fabricating Semiconductor Devices Such as Solar Cells With Anti-reflecting Coating", published Dec. 12, 1990.

Such wafers are converted to effective solar cells by application of contacts on their front and rear surfaces. As exemplified in FIG. 2 the back side of the solar cell wafer is provided with a plurality of mutually spaced silver metal soldering pads 14 and an aluminum back contact 16 that surrounds and makes an electrical connection with pads 14. Preferably the aluminum contact terminates short of the edges of the wafer 2 as shown.

Figure 3:
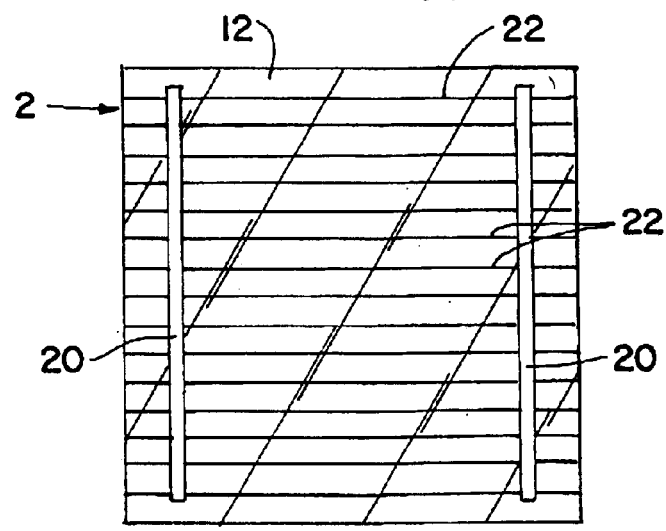
FIG. 3 is a plan view of the front side of the same solar cell.

Referring to FIG. 3, the front side of the solar cell wafer is provided with a grid contact that comprises a pair of bus bars 20 and a plurality of parallel thin fingers 22 that extend across the bus bars. The grid contact extends through the silicon nitride layer 12 and is bonded to the wafer. The front contact may be formed in various ways but the preferred mode involves direct printing the grid contact pattern on the silicon nitride using a silver printing ink that comprises silver particles, a glass frit and an organic fluid as a vehicle for the silver and glass components, and then firing the ink whereby the glass frit penetrates the silicon nitride and enables the silver to form an ohmic bond with the front surface of the underlying silicon wafer.

However, as mentioned hereinabove, the adherence of the silver/glass frit printing ink to the silicon nitride is relatively weak, with the result that in the presence of moisture the finger portions of the grid pattern defined by the silver ink tend to break up or to lift off of the silicon nitride surface, whereby the grid pattern is disrupted. Consequently after firing the grid contact covers less than the intended area or has discontinuities, whereby the finished solar cell exhibits diminished power output and/or is objectionable for cosmetic reasons. This adherence problem is alleviated or effectively overcome by subjecting the solar cell wafer to a corona discharge surface treatment using a plasma jet apparatus.

FIG. 4 schematically illustrates such apparatus. Essentially the plasma jet apparatus comprises an electrical power/control unit 30 and a plasma jet discharge head 32 that is electrically connected to the power/control unit. Plasma discharge head 32 comprises a housing 34 (represented in section) having an air inlet port 36 and a tapered outlet passageway 37 that terminates in an outlet port 38. Two mutually spaced electrodes 40A and 40B are mounted within the housing in proximity to the discharge port. Also mounted within housing 34 is a motorized fan 42 that is designed to suck air into port 36 and propel it out of port 38 as a narrow stream.

The power/control unit is adapted to apply ac electrical power to the electrodes 40A and 40B at a selected voltage and frequency and also to power fan 42 for producing an air stream through plasma jet discharge head 32 as described hereinafter. When the power/control unit is energized to apply an electric potential between the electrodes, a corona discharge occurs that ionizes the air passing between the electrodes. It is to be noted a conventional corona surface treatment apparatus differs from a plasma jet apparatus as herein described and illustrated in how the ionized species is generated and directed. With a plasma jet generator as used with the invention the corona discharge occurs between two electrodes that are positioned over the surface of the substrate to be treated. A conventional corona surface treatment apparatus is designed to accelerate the ionized species towards an electrical ground located behind the treated substrate, which necessitates that the substrate to be treated be an electrical insulator. That requirement prevents use of a conventional corona surface treater for the purpose of this invention, since silicon semiconductor substrates are not electrical insulators.

By way of example but not limitation, a preferred form of plasma jet apparatus is the Model No. PJ-2 system produced by Corotec Corporation of Farmington, Conn. 060320-2834. The cross sectional configuration of the discharge port of the plasma discharge head of such system is limited. Accordingly, depending on the size of the wafers, more than one plasma discharge head may be employed to assure plasma pre-treatment of the entire silicon nitride coating, as illustrated in FIG. 5. Several plasma discharge heads may be coupled to and driven by a single power/control unit as represented at 30.

Referring to FIG. 5, according to the preferred mode of practicing this invention, silicon solar wafers 2 are transported in series on a horizontal conveyor 50. The form of the conveyor is not critical to the invention. The wafers are disposed flat on the conveyor with their silicon nitride coatings facing up. With rectangular or square solar cell wafers, the wafers are oriented so that two opposite side edges thereof are aligned parallel to the direction of movement of the conveyor. Two plasma jet discharge heads 32 are mounted above to the conveyor, with their discharge ports facing down. The plasma discharge heads are mounted so that their discharge ports 36 are aligned and in proximity with the conveyor, close enough to limit dispersion of the ionized jet stream but not so close as to impede flow of ionized air onto the wafers on the conveyor. The two heads are connected to a common power/control unit 30 (not shown in FIG. 4). As noted above, the power/control unit 30 serves two functions: (1) it is adapted to power the motorized fan of each plasma discharge head so as to cause the fan to force a stream of air to pass from air inlet port 38 between the two electrodes and out of discharge port 36 into contact with an adjacent wafer 2; and (2) it is adapted to apply an ac voltage of selected frequency across the two electrodes of each head, whereby to produce a corona discharge between them that ionizes the air stream that exits discharge port 38. The two discharge heads are mounted in overlapping relation to one another transversely of the conveyor, so as to assure complete coverage of the wafers passing beneath them.

The magnitude of the gap between the plasma discharge heads 32 and the wafer being treated and the amplitude and frequency of the voltage applied across the two electrodes are set so as to achieve the desired improvement in the silicon nitride surface without any deterioration of the wafer. The wafer thickness is a minor consideration in relation to possible deterioration. By way of example, solar cell wafers cut out of EFG-grown hollow bodies typically have a thickness in the range of about 0.011" to about 0.015". The gap between plasma discharge port 36 of the head 32 and the wafers is set so as to concentrate the air stream within the opposite side edges of the wafers on the conveyor, i.e., between those edges of the wafers that extend parallel to the direction of movement of the conveyor. By way of example but not limitation, for surface treating EFG-grown square wafers measuring 3.94 inches×3.94 inches and a thickness in the range described above, two plasma jet discharge heads of a Corotec Model No. PJ-2 system are preferably located at a distance of about 2.5 cms from a conveyor 50 on which the wafers are resting, with the wafers spaced apart by about 3 cms on the conveyor and with the latter moving at a speed of about 1000–1200 wafers per hour.

Two significant factors are the amplitude and frequency of the voltage applied across the two electrodes. It has been found that best results are achieved using an ac voltage of about 17,000 volts and a frequency of about 9600 Hz. In contrast, it has been determined that energizing the electrodes with an ac voltage of 7000 volts at a frequency of 20,000 Hz will result in damage to the silicon wafers.

The method of this invention may be incorporated into different processes for applying metal contacts to solar cell substrates. FIG. 6 illustrates one conventional method of forming solar cells from silicon solar cell wafers, modified to include a silicon nitride surface pre-treatment according to the present invention.

Figure 2:
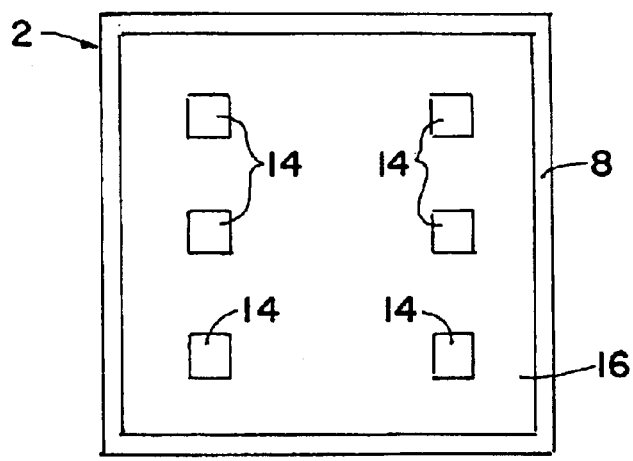
FIG. 2 is a plan view of the back side of a solar cell made from a wafer like that shown in FIG. 1.

Still referring to FIG. 6, polycrystalline silicon solar cell wafers cut out of EFG-grown hollow silicon bodies, e.g., as illustrated in FIGS. 1-3 and measuring 3.94 inches by 3.94 inches are subjected to a plasma jet treatment, preferably one at a time, by conveying them under two plasma jet discharge head 32 as illustrated in FIG. 5, with the two electrodes of each plasma jet discharge head subjected to a voltage of about 17,000 volts varying at a frequency of about 9600 Hz. The latter is operated so that the transit time of each wafer through the ionized air jet emanating from the plasma jet discharge head is about 3 seconds.

Following the plasma jet pre-treatment, the wafers are subjected to a pad printing operation whereby a plurality of mutually spaced small areas of the back surface 8 are covered uniformly with a layer of a silver metal printing ink so as to form discrete blocks of printed silver ink that are to be fired to form soldering pads as shown at 14 in FIG. 2. These printed ink blocks are then dried. Each wafer is then subjected to a second pad printing operation whereby the back surface 8 is coated with a layer of an aluminum printing ink, with that ink covering the back surface around the silver paste blocks and also overlapping the edges of the silver paste blocks, according to the pattern of aluminum back contact 16 which is formed when the aluminum ink is fired. Then the aluminum coating 16 is dried. Next a grid pattern is printed on the surface of the silicon nitride layer 12. This is accomplished in two direct printing operations. First a thick film ink comprising silver particles and a glass frit is applied to the surface of the silicon nitride coating by means of twin nozzles of a direct writing apparatus (not shown) so as to define two parallel bus bars 20. Then, after the bus bars have dried, a plurality of direct printing nozzles of a direct writing apparatus (not shown) apply a thick film ink comprising silver particles and a glass frit to the silicon nitride surface in the form of a plurality of parallel thin fingers 22 that extend across the bus bars. Then without another drying operation for the fingers, the solar cell wafers are passed to a firing stage where the wafers are fired in an oxygen-containing atmosphere in a radiant heated belt furnace operating at a selected temperature in the order of 790 degrees C. The transit time through the furnace is set so that the solar cell wafers are ramped up to peak temperature of the furnace (about 790 degrees C.), held at that temperature for a few seconds, and then ramped down to a temperature of about 70 degrees C. as they leave the furnace. The firing causes the aluminum in the aluminum ink of back surface 8 to alloy to the silicon and form back contact 16, and causes the silver component of the silver ink blocks to bond to the underlying silicon substrate to form the soldering pads 14. The firing also causes the glass frit of the ink applied to the front side of the solar cell wafer to penetrate the silicon nitride and allow the silver particles to fuse to the front surface of the silicon substrate, thereby forming a grid electrode as shown in FIG. 4 that is ohmically bonded to the silicon substrate.

The techniques employed in the foregoing method of forming contacts on solar cell substrates, including the compositions of the thick film inks, are well-known, being described, for example, in U.S. Pat. No. 5151,386, cited supra and incorporated herein by reference thereto, and also U.S. Pat. No. 5,320,684, issued Jun. 14, 1994 to J. Amick et al. for "Solar Cell And Method Of Making Same", and U.S. Pat. No. 5,118,362, issued Jun. 2, 1992 to D. A. St. Angelo et al. for "Electrical Contacts And Methods of Manufacturing Same", also incorporated herein by reference thereto.

Solar cells pre-treated with a jet of ionized air and provided with metal contacts as described above in connection with FIG. 6 have been found to be substantially free of the ink-lifting problem described above, with a consequent improvement in the yield of solar cells with acceptable grid contacts. A further advantage of the silicon nitride pre-treatment is that it does not affect or require changes to the steps normally used in printing and firing front and back contacts and is not tied to the specific method of making solar cells illustrated in FIG. 6. Thus a different method may be used to form the back contact, and the back contact need not have silver soldering pads as described herein. Another approach is to apply the aluminum coating to the back surface of the solar cell wafer applied first so as to form a plurality of apertures, with the silver soldering pads subsequently being applied in those apertures so as to slightly overlap the aluminum coating. Also a different grid contact pattern may be used. It also is considered that the pre-treatment may be used to advantage if the grid electrode is formed by screen printing, although direct printing has been found to provide superior results with respect to the aspect ratio of the fingers. Although the invention has been described as employing two plasma jet discharge heads for treating solar cell wafers traveling one at a time past the heads, it is contemplated that only one, or more than two, plasma discharge heads may be employed and also that two or more rows of cells may be accommodated on the conveyor for treatment by one or more discharge heads. Also it is contemplated that the plasma pre-treatment may be carried out by subjecting the electrodes to voltages of a different amplitude and frequency, depending on the size and manufacture of the jet plasma discharge heads. Still other advantages and modifications will be obvious to persons skilled in the art.

What is claimed is:

1. Method for forming a grid contact on a silicon solar cell wafer comprising a silicon substrate having oppositely facing first and second surfaces, a p-n junction adjacent said first surface, and a silicon nitride coating on said first surface, said method comprising the following steps:

(a) subjecting said silicon nitride coating to an air plasma jet produced by plasma ionization of air;

(b) direct printing on said silicon nitride coating a grid contact pattern using an ink comprising silver particles, a glass frit and an organic vehicle; and (c) heating said silicon solar cell wafer in an oxygen-containing atmosphere to a temperature and for a time sufficient to cause said glass frit to penetrate said silicon nitride so that said silicon particles will engage and form an ohmic contact with said first surface.

2. Method according to claim 1 wherein said plasma jet is generated by creating an electrical discharge using an alternating current source operating at a voltage of about 17,000 volts and a frequency of about 9600 Hz.

3. Method according to claim 1 wherein said silicon substrate has a thickness in range of 0.008 to about 0.014 inch and prior to step (a) said silicon nitride coating has a thickness in the range of about 600 to about 1000 angstroms.

4. Method according to claim 1 wherein step (b) is conducted using a plasma jet apparatus having two mutually spaced electrodes and the plasma jet is produced by blowing a stream of air between said electrodes and onto said silicon nitride coating and simultaneously creating an electrical discharge between said electrodes whereby to ionize said air.

5. Method according to claim 4 wherein said plasma jet has a relatively small cross-sectional area, and further wherein said solar cell wafer is transported past said plasma jet so that successive areas of the surface of the silicon nitride coating are subjected to said plasma.

6. Method according to claim 5 wherein said solar cell wafer is transported past said plasma jet at a speed such that the entire wafer passes through the plasma jet within about 3 seconds.

7. Method according to claim 6 wherein said solar cell wafer is rectangular and is aligned so that two opposite edges thereof are aligned parallel to its direction of transport through the plasma jet.

8. Method for forming contacts on silicon solar cell wafers comprising a silicon substrate having oppositely facing first and second surfaces, a p-n junction adjacent said first surface, and a silicon nitride coating on said first surface, said method comprising the following steps:

(a) applying a conductive metal paste coating on said second surface;

(b) subjecting said silicon nitride coating to an air plasma jet produced by plasma ionization of air so as to increase the surface wettability of said coating;

(c) direct printing on said silicon nitride coating a grid contact pattern using an fluid printing composition comprising silver particles, a glass frit and an organic vehicle; and (d) heating said silicon solar cell wafer in an oxygen-containing atmosphere to a temperature and for a time sufficient to (1) cause said glass frit to penetrate said silicon nitride so that said silicon particles will engage and form an ohmic contact with said first surface, and cause the metal component of said metal paste to form an adherent ohmic contact on said second surface.

9. Method according to claim 8 wherein said metal paste comprises aluminum particles and said particles alloy with said silicon substrate as a result of step (d).

10. Method according to claim 8 wherein a first aluminum-containing metal paste and a second silver-containing metal paste are applied to said second surface prior to step (b), said first metal paste being applied to at least one selected first area portion of said second surface and said second metal paste being applied to at least one selected second area portion of said second surface, with said first metal paste and said second metal paste contacting one another; and further wherein the heating in step (d) is conducted so that the aluminum in said first paste forms an alloy with the silicon at said second surface and the silver in said second paste forms an adherent ohmic bond with said second surface of said silicon substrate.

11. Method according to claim 10 wherein said plasma jet has a relatively small cross-sectional area, and further wherein said solar cell wafers are transported in series past said plasma jet so that successive areas of the surface of the silicon nitride coating on each solar cell wafer are subjected to said plasma.

12. Method according to claim 11 wherein said solar cell wafers are transported past said plasma jet at a speed such that the transit time for each wafer through the plasma jet is within about 3 seconds.

13. Method according to claim 12 wherein said solar cell wafers are rectangular and are aligned so that two opposite edges thereof extend parallel to the direction of transport of the wafers through the plasma jet.

14. Method according to claim 10 wherein said plasma jet is generated by creating an eternal discharge using an alternating current source operating at a voltage of about 17,000 volts and a frequency of about 9600 Hz.

\* \* \* \* \*

UNITED STATES PATENT AND TRADEMARK OFFICE
CERTIFICATE OF CORRECTION

PATENT NO. : 6,815,246 B2
DATED : November 9, 2004
INVENTOR(S) : Ronald C. Gonsiorawski et al.

It is certified that error appears in the above-identified patent and that said Letters Patent is hereby corrected as shown below:

Column 8,
Line 36, "an fluid" should be changed to -- a fluid --; and

Column 10,
Line 2, "eternal" should be changed to -- electrical --.

Signed and Sealed this

Fifteenth Day of February, 2005

JON W. DUDAS
*Director of the United States Patent and Trademark Office*